United States Patent [19]

Kaufman

[11] Patent Number: 4,546,410
[45] Date of Patent: Oct. 8, 1985

[54] CIRCUIT PACKAGE WITH MEMBRANE, CONTAINING THERMOCONDUCTIVE MATERIAL, RUPTURED AGAINST A HEAT SINK

[76] Inventor: Lance R. Kaufman, 131 N. White Oak Way, Mequon, Wis. 53092

[21] Appl. No.: 547,031

[22] Filed: Oct. 31, 1983

[51] Int. Cl.⁴ ............................................. H05K 7/20
[52] U.S. Cl. ...................................... 361/387; 29/832; 206/330; 165/185
[58] Field of Search ............... 29/458, 825, 832; 361/382, 383, 385, 386, 387, 388; 206/219, 328, 330; 174/16 HS; 357/81; 165/185, 104.15, 104.33, 80 D

[56] References Cited

U.S. PATENT DOCUMENTS

| | | |
|---|---|---|
| 3,958,075 | 5/1976 | Kaufman . |
| 4,092,697 | 5/1978 | Spaight ............................ 361/386 |
| 4,156,148 | 5/1979 | Kaufman . |
| 4,196,411 | 4/1980 | Kaufman . |
| 4,215,235 | 7/1980 | Kaufman . |
| 4,218,724 | 8/1980 | Kaufman . |
| 4,250,481 | 2/1981 | Kaufman . |
| 4,257,091 | 3/1981 | Kaufman . |
| 4,266,140 | 5/1981 | Kaufman . |
| 4,394,530 | 7/1983 | Kaufman ...................... 174/16 HS |

OTHER PUBLICATIONS

On Board Logic . . . Printhead, Mizzi, IBM Tech. Discl. Bull., vol. 24, No. 1A, Jun. 1981, p. 284.

*Primary Examiner*—G.P. Tolin
*Attorney, Agent, or Firm*—Andrus, Sceales, Starke & Sawall

[57] ABSTRACT

An electronic circuit package mountable to a heat sink is provided with burstable membrane means adhesively stuck to the circuit package and containing thermoconductive material. Upon mounting of the circuit package to the heat sink, the membrane means ruptures, and the thermoconductive material, such as silicon grease, is automatically spread along the interface of the circuit package and the heat sink to enhance heat transfer. There is no need for a manual separate step to spread the grease at the time of installation.

8 Claims, 4 Drawing Figures

CIRCUIT PACKAGE WITH MEMBRANE, CONTAINING THERMOCONDUCTIVE MATERIAL, RUPTURED AGAINST A HEAT SINK

BACKGROUND AND SUMMARY

The invention relates to a compact circuit package mountable to a heat sink in good heat transfer relation.

Compact circuit packages housing power conditioning electronic components must dissipate the heat generated by such components, for example by means of a heat sink. The circuit package typically includes an electrically insulative thermally conductive substrate, circuit means including heat generating components on the top side of the substrate, and an electrically insulating housing covering the substrate and circuitry. The package is mounted to a heat sink such that the heat generated by the circuitry is transferred through the substrate to the heat sink, for example as shown in Kaufman U.S. Pat. No. 4,218,724.

It is desirable to provide for maximum heat transfer from the circuit package to the heat sink. In order to fill the interstices in the substrate and heat sink surfaces, silicon grease has previously been manually applied to these surfaces before mounting to thereby improve heat transfer characteristics. Such grease application was normally done in situ. The circuit package installer dipped his fingers into a container of grease and spread the grease onto the ceramic substrate and the heat sink with his fingers. This was a messy operation, and also required that the installer have a supply of grease readily at hand.

There is a need for a simple, effective technique for providing thermoconductive material at the interface of the heat sink and the circuit package for enhancing heat transfer. One solution is shown in my co-pending Application Ser. No. 06/546,999, filed Oct. 31, 1983.

The present invention provides another solution. In the present invention, the circuit package includes membrane means containing thermoconductive material for rupturing against a heat sink to spread the thermoconductive material along the interface of the circuit package and the heat sink. The membrane means is adhesively stuck to the circuit package and ruptures upon compressive engagement with the heat sink when the circuit package is mounted thereto. The thermoconductive material is automatically applied to the interface of the circuit package and heat sink without manual intervention or a separate step.

In the preferred embodiment, the membrane means comprises a plurality of burstable granules each encapsulating a nodule of thermoconductive material and adhesively stuck to the bottom of the substrate. The granules burst upon pressured engagement with the heat sink to spread the contained thermoconductive material. In an alternate embodiment, a single burstable membrane encapsulates the thermoconductive material and is adhesively stuck to the bottom of the substrate.

DETAILED DESCRIPTION

Figure 1:
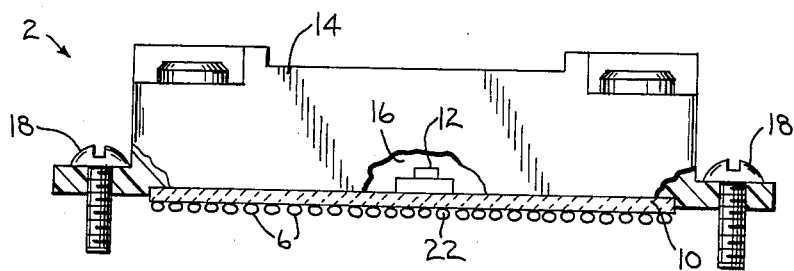
FIG. 1 is a side elevation view of a circuit package in accordance with the invention, with parts in section.
Figure 2:
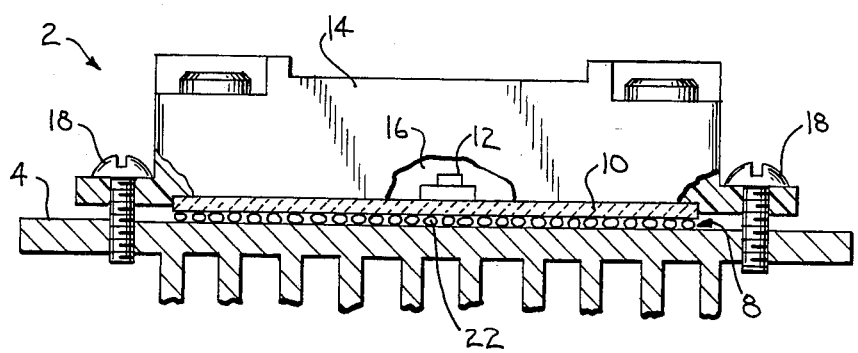
FIG. 2 is a view like FIG. 1 and shows engagement against a heat sink.

There is shown in FIGS. 1 and 2 a circuit package 2 for mounting against a heat sink 4. The circuit package has membrane means 6, containing thermoconductive material such as silicon grease, for rupturing against heat sink 4 to spread the thermoconductive material along the interface 8 of the circuit package and the heat sink to enhance heat transfer from the circuit package to the heat sink.

Circuit package 2 includes an electrically insulative thermally conductive substrate 10, such as a rigid planar ceramic sheet. Circuit means such as 12 are mounted on the top side of substrate 10. Circuit means 12 includes heat generating electronic power conditioning components, lead frames and the like, for example as shown in the above noted Kaufman U.S. Pat. No. 4,218,724. An electrically insulating housing 14 has a downwardly opening cavity 16 covering substrate 10 and circuit means 12, for example as shown in the noted Kaufman patent. Threaded screws such as 18, through peripheral flanges of the housing, mount and secure the circuit package to heat sink 4. Membrane means 6 is adhesively stuck to the bottom of substrate 10.

Figure 3:
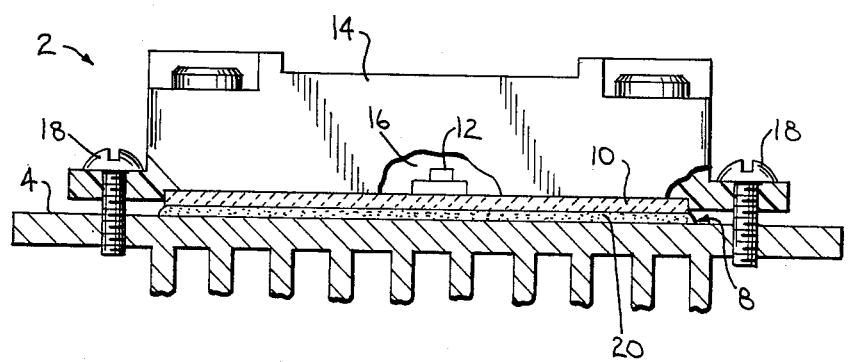
FIG. 3 is a view like FIG. 2 and shows the mounted condition against a substrate.

As shown in FIGS. 2 and 3, membrane means 6 is ruptured upon compressive engagement with heat sink 4. Mounting of circuit package 2 to heat sink 4 ruptures membrane means 6 and automatically applies the thermoconductive material 20, FIG. 3, along interface 8 without manual intervention or a separate step to apply the thermoconductive material.

In preferred form, membrane means 6 comprises a plurality of burstable granules 22 each encapsulating a nodule of thermoconductive material and adhesively stuck to the circuit package. Granules 22 burst, FIGS. 2 and 3, upon pressured engagement with heat sink 4 to spread, FIG. 3, the contained thermoconductive material 20 along interface 8. FIG. 3 shows the mounted condition of circuit package 2, with thermoconductive material 20 filling the interstices in the top surface of heat sink 4 and the bottom surface of ceramic substrate 10.

Figure 4:
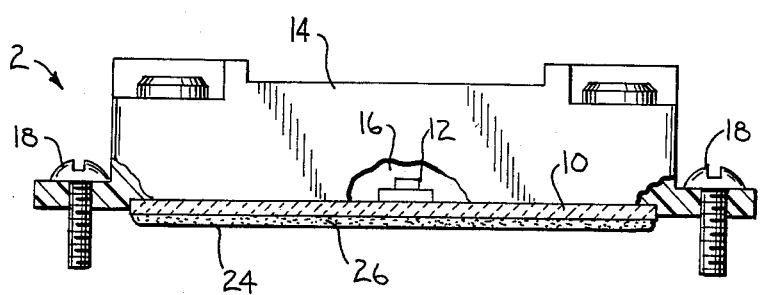
FIG. 4 is a view like FIG. 1 and shows an alternate embodiment.

FIG. 4 shows an alternate embodiment and like reference numerals are used where appropriate to facilitate clarity. The membrane means comprises a single burstable membrane 24 encapsulating thermoconductive material 26 and adhesively stuck to the circuit package along the bottom side of substrate 10. Membrane 24 bursts upon pressured engagement with heat sink 4 to spread the contained thermoconductive material 26 along interface 8 and yield the mounted condition shown in FIG. 3.

It is recognized that various modifications are possible within the scope of the appended claims.

I claim:

1. A circuit package mounted against a heat sink and having membrane means, containing thermoconductive material, and rupturing against said heat sink to spread said thermoconductive material along the interface of said circuit package and said heat sink to enhance heat transfer from said circuit package to said heat sink.

2. The invention according to claim 1 wherein said membrane means is ruptured upon compressive engagement with said heat sink.

3. The invention according to claim 2 wherein said membrane means is adhesively stuck to said circuit package such that mounting of the latter to said heat sink ruptures said membrane means and automatically applies said thermoconductive material to said interface without manual intervention or a separate step to apply said thermoconductive material.

4. The invention according to claim 3 wherein said membrane means comprises a plurality of burstable granules each encapsulating a nodule of said thermoconductive material and adhesively stuck to said circuit package and burst upon pressured engagement with said heat sink to spread the contained said thermoconductive material along said interface.

5. The invention according to claim 3 wherein said membrane means comprises a single burstable membrane encapsulating said thermoconductive material and adhesively stuck to said circuit package and burst upon pressured engagement with said heat sink to spread the contained said thermoconductive material along said interface.

6. A circuit package mounted to a heat sink, comprising:
an electrically insulative thermally conductive substrate;
circuit means on the top side of said substrate;
an electrically insulating housing covering said substrate and circuit means; and
membrane means containing thermoconductive material adhesively stuck to the bottom side of said substrate and rupturing against said heat sink to spread said thermoconductive material along the interface of said heat sink and said bottom side of said substrate.

7. The invention according to claim 6 wherein said membrane means comprises a plurality of burstable granules each encapsulating a nodule of said thermoconductive material and adhesively stuck to said bottom side of said substrate and burst upon pressured engagement with said heat sink to spread the contained said thermoconductive material along said interface.

8. The invention according to claim 6 wherein said membrane means comprises a single burstable membrane encapsulating said thermoconductive material and adhesively stuck to said bottom side of said substrate and burst upon pressured engagement with said heat sink to spread the contained said thermoconductive material along said interface.

* * * * *